United States Patent [19]

Miyamoto et al.

[11] Patent Number: 4,513,257
[45] Date of Patent: Apr. 23, 1985

[54] PROXIMITY SWITCH WITH OPPOSITELY POLARIZED COILS

[75] Inventors: Kiyoshi Miyamoto, Nagaokakyo; Kenji Ueda, Otsu, both of Japan

[73] Assignee: Omron Tateisi Electronics Co., Kyoto, Japan

[21] Appl. No.: 445,850

[22] Filed: Dec. 1, 1982

[30] Foreign Application Priority Data

Dec. 3, 1981 [JP] Japan .................. 56-195455
Dec. 17, 1981 [JP] Japan .................. 56-189180[U]

[51] Int. Cl.³ .................. G01P 13/00; H01F 27/38
[52] U.S. Cl. .................. 331/65; 336/181; 324/236; 324/327
[58] Field of Search .................. 324/207, 208, 236, 237, 324/327, 225; 331/65; 336/181

[56] References Cited

U.S. PATENT DOCUMENTS 3,747,036  7/1973  Erdmann .................. 336/181 X
4,056,769  11/1977  Lefebvre et al. .................. 324/236

FOREIGN PATENT DOCUMENTS 2713151  9/1978  Fed. Rep. of Germany ...... 324/207
65469    5/1977  Japan .................. 324/207
61806    5/1981  Japan .................. 331/65

Primary Examiner—Eugene R. LaRoche
Assistant Examiner—W. R. Paxman
Attorney, Agent, or Firm—Wegner & Bretschneider

[57] ABSTRACT

A proximity switch comprising a detection coil, a first capacitor connected in parallel with the detection coil for forming a resonant circuit, an auxiliary coil, a second capacitor connected in parallel with the auxiliary coil for forming a resonant circuit, an oscillation circuit connected to the detection and auxiliary coils which are connected in series and in reverse winding directions, and an output circuit connected to the oscillation circuit for receiving variations in output generated from the oscillation circuit, the second capacitor having a capacitance larger than that of the first capacitor so that the second capacitor has a reduced low impedance at an oscillation frequency determined by the detection coil and the first capacitor.

6 Claims, 5 Drawing Figures

PROXIMITY SWITCH WITH OPPOSITELY POLARIZED COILS

BRIEF SUMMARY OF THE INVENTION

This invention relates to a high-frequency type proximity switch, and more particularly to an improved proximity switch capable of precisely detecting an object in a strong magnetic field.

A high-frequency oscillation type proximity switch is well known and comprises a detection coil to form a high-frequency oscillation circuit, wherein the conductance of the detection coil equivalently increases on approach of an object to be detected by the proximity switch, so that the oscillation output of the oscillation circuit varies and the variation is detected by a circuit associated with the oscillation circuit so as to generate a detection signal representing the presence of the object. The detection coil of the conventional proximity switch, however, is coupled to a ferrite core, so that the proximity switch under the existence of an external a.c. or d.c. magnetic field cannot perform its detection operation perfectly. Such an imperfection of the proximity switch is based on the fact that magnetic lines of force in an a.c. or d.c. magnetic field are focused into the ferrite core so that the permeability of the core is reduced and the core is saturated. As a result, the inductance of the detection coil is reduced so as to cause increased loss by the coil, similar to that present when a metal object is near the coil. Moreover, in an a.c. magnetic field, a voltage having a relatively large amplitude is induced in the detection coil, so that the induced voltage causes the proximity switch to give a false indication. Thus, an imperfect operation is developed in a switch which is installed in a magnetic field.

It is, therefore, a primary object of this invention to provide a proximity switch capable of precisely detecting an object to be detected by the switch even if the switch is installed in an a.c. or d.c. magnetic field.

It is a further object of this invention to provide a high-frequency oscillation type proximity switch which includes an auxiliary coil connected to a detection coil, and is easy to assemble.

Other objects and advantages of this invention will be apparent upon reference to the following description in conjunction with accompanying drawings, in which:

DETAILED DESCRIPTION

Figure 1:
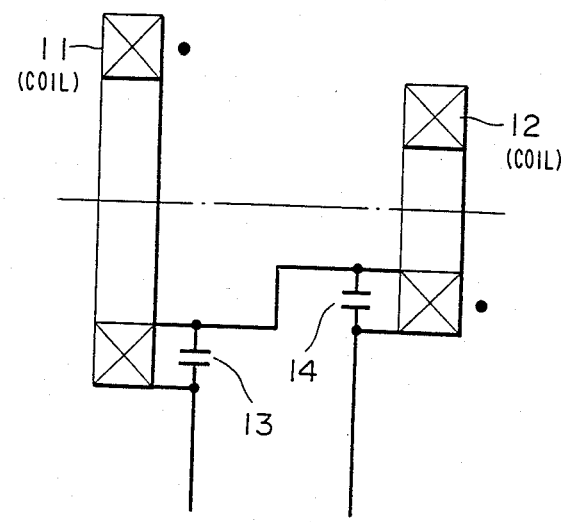
FIG. 1 is a schematic view showing an arrangement of a resonance circuit of a proximity switch as a preferred embodiment of this invention.

Referring, now, to FIG. 1, there is shown a resonant circuit as a preferred embodiment of this invention. The resonant circuit includes a resonant circuit consisting of a detection coil 11 and a first capacitor 13 connected in parallel with the coil 11, and a resonant circuit consisting of an auxiliary coil 12 disposed near the coil 11 and a second capacitor 14 connected in parallel with the coil 12. Though the auxiliary coil 12 is disposed coaxially with the coil 11 in FIG. 1, it is not necessary that the coils be disposed coaxially because an external magnetic field is applied to them almost in parallel. The detection and auxiliary coils 11 and 12 are connected together in series and wound in directions opposite to each other. These coils 11 and 12 both are coreless, and have an equivalent product of an effective area and a number of turns. Therefore, when these two coils 11 and 12 are exposed to an a.c. magnetic field, an equivalent voltage, with induced electromotive force, is induced in each of the coils, but is cancelled in each because the coils are connected in reverse winding directions. These two coils 11 and 12 are disposed so as to reduce the high-frequency coupling therebetween. The capacitance of the capacitor 14 is designed to be much larger than that of the capacitor 13. For example, the capacitor 13 may be 3000 pF and the coil 14 may be $10 \times 10^4$ pF.

Figure 2:
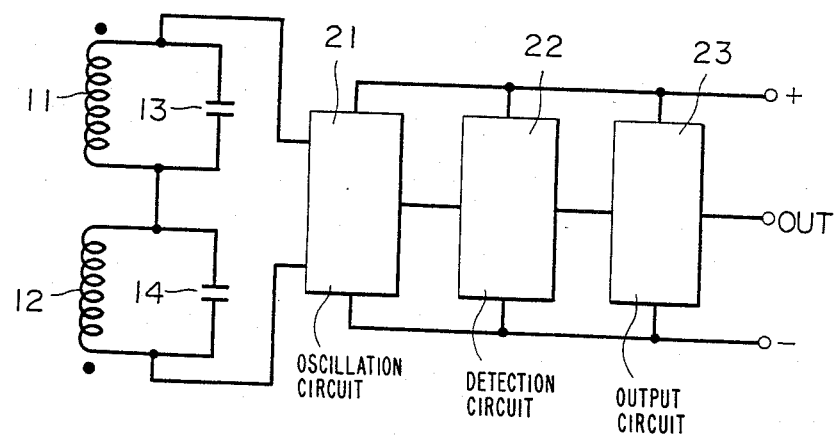
FIG. 2 is a schematic block diagram of the proximity switch employing the circuit of FIG. 1.

As shown in FIG. 2, the resonant circuit of FIG. 1 is connected to an oscillation circuit 21. Since the capacitance of the capacitor 14 is much larger than that of the capacitor 13, the conductance of the resonant circuit consisting of the coil 11 and the capacitor 13 is much smaller than that of the resonant circuit consisting of the coil 12 and the capacitor 14. Therefore, under a normal condition where there is no external magnetic field, in a resonance frequency determined by the constants of the coil 11 and the capacitor 13, the oscillation circuit 21 oscillates, while the impedance of the capacitor 14 at such a resonance frequency is reduced by the large capacitance of the capacitor 14 to the extent that the auxiliary coil 12 has little effect on the function of the detection coil 11.

The oscillation amplitude of the oscillation circuit 21 varies on approach of a metal object to the detection coil 11, and the variation of the oscillation amplitude is detected by a detection circuit 22 so as to generate a detection signal through an output circuit 23.

Figure 3:
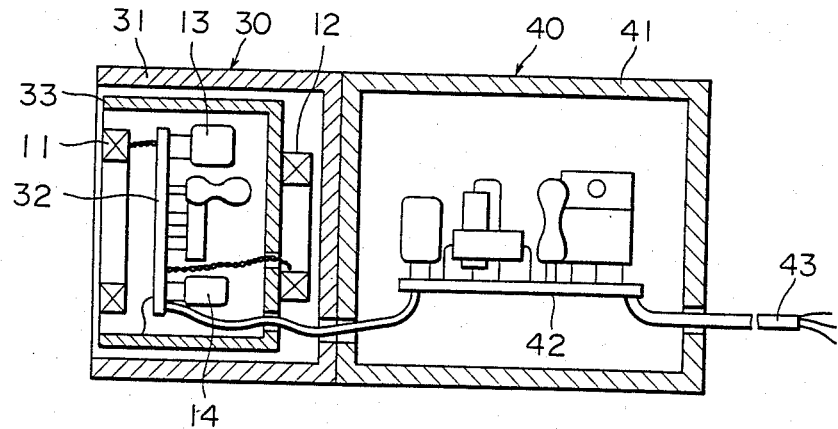
FIG. 3 is a sectional view of the proximity switch.

Returning to FIG. 3, there is illustrated the assembled proximity switch which includes a detection head portion 30 housed within a metal housing 31 in the shape of a cylinder or a rectangular tube, and a body portion 40 housed within a metal housing 41 in the shape of a cylinder or a rectangular tube. The metal housings 31 and 41 are coupled together. The metal housing 31 encloses the detection coil 11, the auxiliary coil 12, a printed-circuit board 32 on which there are mounted the capacitors 13 and 14, the oscillation circuit 21 and the detection circuit 22, and a metal case 33 in the shape of a cylinder or a rectangular tube. The case 33 covers the circuit components with an electrostatic shielding, and is disposed between the coils 11 and 12 so as to reduce high-frequency coupling therebetween. Since the impedance of the capacitor 14 in the oscillation frequency decided by the resonance circuit of coil 11 and capacitor 13 is regarded as nearly zero, if the magnetic flux generated from the detection coil 11 passes through the auxiliary coil 12, an eddy current is developed through the capacitor 14 and the coil 12 so as to generate an eddy current loss. Therefore, in order to reduce such an eddy current loss, the high-frequency coupling between the coils 11 and 12 must be reduced. For this purpose, the metal case 33 is made of brass or aluminum in which very little eddy current loss is produced, and disposed between the coils 11 and 12. An external magnetic field is at a low frequency, e.g. a commercial frequency such as 60 Hz or 50 Hz, and induces in both coils 11 and 12 the above-mentioned same induced voltage, irrespective of the existence or non-existence of the metal case 33. Within the metal case 41 of the body portion 40, there is housed a printed-circuit board 42 on which the output circuit 23 (see FIG. 2) is mounted. A cable 43 outwardly extends from one end of the case 41 for an electric power supply and an output signal of the proximity switch. Though it is not shown in FIG. 3 for the convenience of illustration, the cases 31 and 41 are filled with hardened plastics for firmly supporting the enclosed circuit components and insulating them from any foreign matter and for providing electrical insulation. If desired, the filled plastics may be omitted. Moreover, the wall portion between chambers of the cases 31 and 41 may be omitted.

Figure 4:
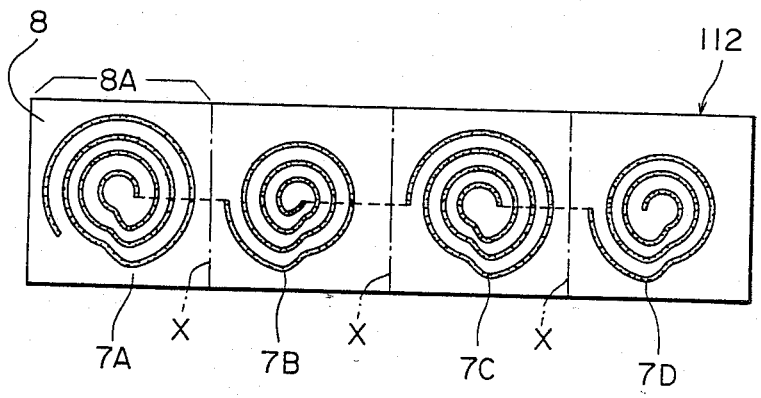
FIG. 4 is an unfolded view of an auxiliary coil employed in a proximity switch as a modified embodiment of this invention.
Figure 5:
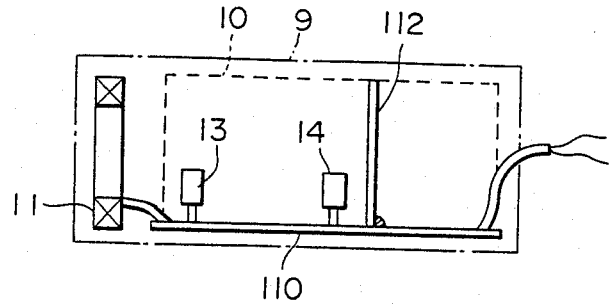
FIG. 5 is a schematic sectional view of the proximity switch employing the coil of FIG. 4.

Referring to FIGS. 4 and 5, there is shown a proximity switch as a modified embodiment of this invention. The auxiliary coil 12 of FIG. 1 is modified in this embodiment to a printed-circuit board coil 112 as illustrated in FIGS. 4 and 5. The detection coil 11, the capacitors 13 and 14, and the auxiliary coil 112 are wired as those in FIG. 2, and similarly designed. The auxiliary coil 112 in this embodiment as illustrated in FIG. 4 consists of a flexible base plate 8 and a plurality of spiral conductive patterns 7A through 7D printed on the plate 8. The respective patterns are connected in series and printed in reverse directions as illustrated in FIG. 4 so as to form a continuous same direction coil when the plate 8 is folded along the one-dotted lines X. The printed patterns may be coated with insulating film. The folded coil 112 is illustrated in FIG. 5. The coil 112 stands on a printed circuit board 110 on which other associated circuit components, surrounded with a dotted line 10 and including capacitors 13 and 14, are mounted. The coil 112 is fixed to the board 110 in parallel with and sufficiently apart from the detection coil 11 so as to avoid mutual magnetic induction between the coils 11 and 112. Since the coil 112 is of a printed circuit board, it is easily mounted on the board 110 and firmly supported against external mechanical shock. Moreover, problems such as a wire of the coil snapping from external mechanical shock are overcome. The board 110 is supported by grooves formed on inner walls of a housing 9. The coil 112 of FIG. 4 may be modified so that it consists of only one plate section 8A having the spiral print 7A on a front surface of the plate section 8A or a pair of spiral prints on the front and reverse surfaces of the plate. The plate 9A may be a solid plate.

Thus, according to this invention, there is provided a proximity switch which includes an auxiliary coil for cancelling any induced electromotive force developed in a detection coil by an external magnetic field and a capacitor connected in parallel with the auxiliary coil so as to prevent the oscillation in the detection coil from being affected by the auxiliary coil. Moreover, since the detection and auxiliary coils are coreless, there is none of the focusing into the coils by the lines of magnetic induction. Thus, the switch can perfectly perform its detecting operation, even under conditions of a strong magnetic field. It is experimentally proved that the proximity switch can perfectly work adjacent to an electric welding machine where a strong magnetic field is generated by a welding a.c. current of several thousand amperes in the machine and any conventional high-frequency oscillation proximity switches cannot be used.

It should be understood that the above description is merely illustrative of this invention and that many changes and modifications may be made by those skilled in the art without departing from the scope of appended claims.

What we claim is:

1. A proximity switch comprising
   a detection coil,
   a first capacitor connected in parallel with the detection coil for forming a resonant circuit,
   an auxiliary coil,
   a second capacitor connected in parallel with the auxiliary coil for forming a resonant circuit,
   an oscillation circuit connected to said detection and auxiliary coils which are connected in series and in reverse winding directions, and
   an output circuit connected to the oscillation circuit for detecting variations in the output of the oscillation circuit, said second capacitor having a capacitance larger than that of the first capacitor so that said second capacitor has a reduced low impedance at an oscillation frequency determined by the detection coil and the first capacitor.

2. A proximity switch according to claim 1, in which the auxiliary coil is located in a plane parallel with that of the detection coil to reduce high-frequency coupling between said detection and auxiliary coils.

3. A proximity switch according to claim 2 further comprising a metal case which has a reduced eddy current loss and is disposed between said detection and auxiliary coils.

4. A proximity switch according to claim 1, wherein said auxiliary coil is a printed-curcuit board having a conductive spiral pattern.

5. A proximity switch according to claim 4, wherein said sprial pattern consists of a plurality of spirals printed on the printed-circuit board.

6. A proximity switch according to claim 1, wherein said detection and auxiliary coils are coreless.

* * * * *